(12) United States Patent
Kim et al.

(10) Patent No.: US 6,577,175 B2
(45) Date of Patent: Jun. 10, 2003

(54) METHOD FOR GENERATING INTERNAL CLOCK OF SEMICONDUCTOR MEMORY DEVICE AND CIRCUIT THEREOF

(75) Inventors: Nam-Seog Kim, Seoul (KR); Jung-Woo Park, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/041,091

(22) Filed: Jan. 7, 2002

(65) Prior Publication Data

US 2002/0180499 A1 Dec. 5, 2002

(30) Foreign Application Priority Data

Jun. 1, 2001 (KR) .......................................... 2001-30749

(51) Int. Cl.⁷ ................................................. H03L 7/06
(52) U.S. Cl. ........................................ 327/161; 327/158
(58) Field of Search ................................ 327/141, 144, 327/147, 149, 150, 152, 153, 155, 158, 159, 161, 261, 270, 271, 276, 277, 284, 299

(56) References Cited

U.S. PATENT DOCUMENTS

| | | | |
|---|---|---|---|
| 5,349,612 A | * | 9/1994 | Guo et al. ................... 375/371 |
| 5,400,370 A | * | 3/1995 | Guo ............................ 375/371 |
| 6,229,364 B1 | * | 5/2001 | Dortu et al. ................. 327/158 |
| 6,252,443 B1 | * | 6/2001 | Dortu et al. ................. 327/156 |
| 6,388,485 B2 | * | 5/2002 | Kim ............................ 327/161 |

* cited by examiner

Primary Examiner—My-Trang Nuton
(74) Attorney, Agent, or Firm—F. Chau & Associates, LLP

(57) ABSTRACT

The invention relates to a semiconductor memory device and a method for generating an internal clock, the circuit of the semiconductor device including: a receiver for receiving an external clock; a delay compensation circuit for receiving an output of the receiver and delaying it by as much as the compensation delay time and control delay time subtracted out of a cycle of the external clock; an external control delay part for delaying an output of the delay compensation circuit by as much as the control delay time and unit increase/decrease delay time in response to an external control code; and an internal clock driver for driving an output of the external control delay part and generating an internal clock centered to externally applied data, thereby performing an accurate timing control to an external clock without loss of performance.

12 Claims, 7 Drawing Sheets

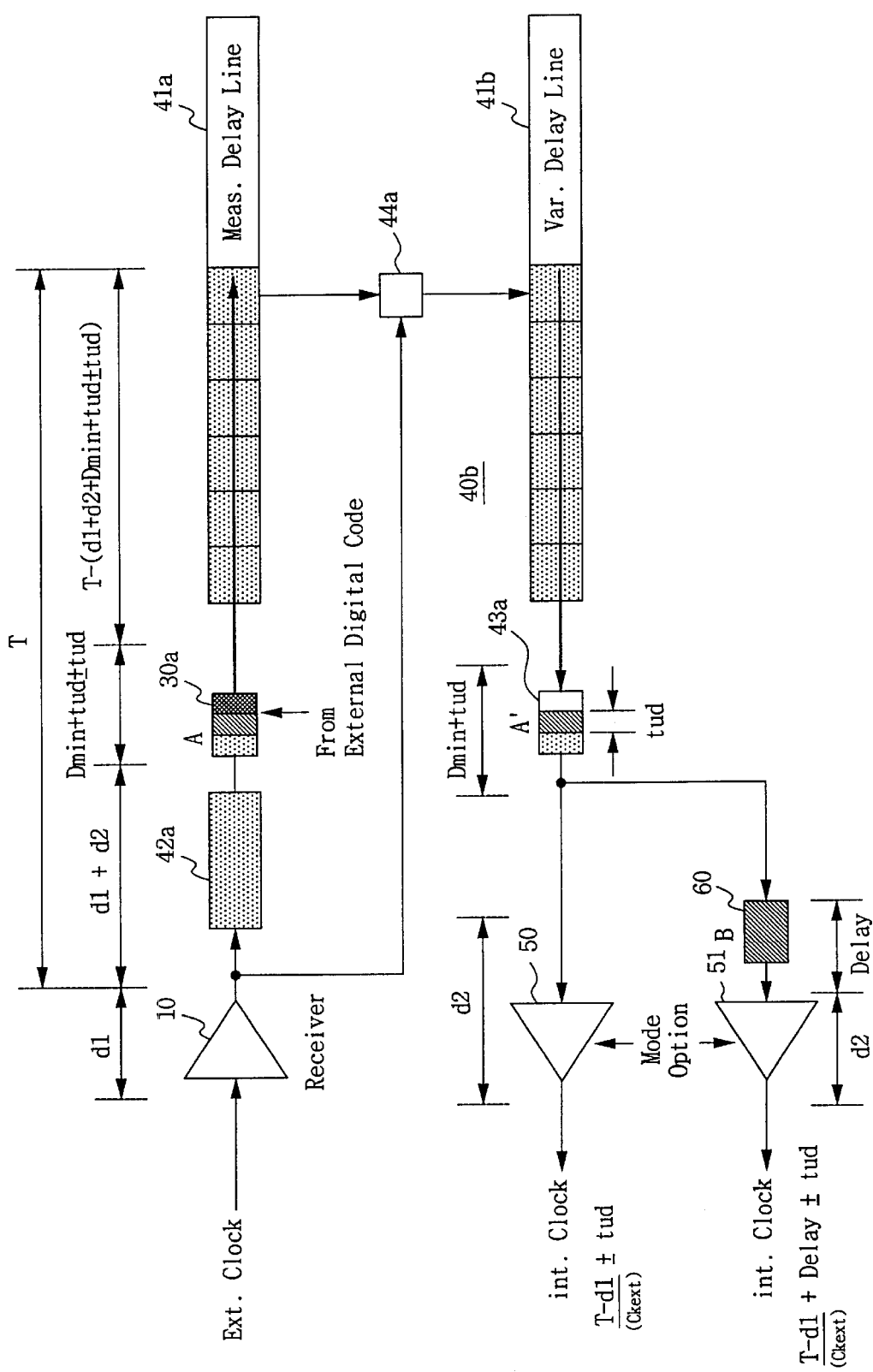

METHOD FOR GENERATING INTERNAL CLOCK OF SEMICONDUCTOR MEMORY DEVICE AND CIRCUIT THEREOF

BACKGROUND OF THE INVENTION

1. Field of the Invention

The present invention relates to a device and a method for internal clock generation and, more particularly, to a device and method for generating an internal clock synchronized with an external clock.

2. Description of the Related Art

In a typical electronic system, a central processing unit (CPU) and a semiconductor memory are interconnected through a signal bus. Typically, the CPU operates as a master, and the semiconductor memory operates as a slave. The CPU transmits data such as addresses, commands, and writing data, and a clock for sampling the data to the semiconductor memory.

An external clock signal transmitted through the signal bus may be synchronized with or centered to data as shown in FIGS. 1A and 1B, respectively. The memory as a slave receives the external clock signal to generate a data sampling clock as an internal clock signal, which should be transitioned with the triggering edge around the center of data signals as shown in FIG. 1B. If the external clock signal is synchronized with the data, it is delayed to generate an internal clock signal centered about the data signal.

If an external clock signal is centered on or synchronized with data, the memory as a slave uses an internal clock signal adapted to a data valid window for sampling externally applied data. As the data rate increases, the data valid window becomes smaller. If the data and the clock signal have slightly different paths in the system, the skew between the clock signal and the data pins applied to the memory may further increase. In the case of DDR (double data rate) memories, in which data are clocked at both transactions within a clock cycle as shown in FIG. 2A, a large skew results in false clocking of data.

Therefore, a need exists for a semiconductor memory system having a function to selectively alter the timing of a clock signal to generate a data sampling clock signal as an internal clock signal which maximizes the data clocking data window, essentially as shown in FIG. 3.

SUMMARY OF THE INVENTION

It is an object of the present invention to solve the aforementioned problems and provide a method for generating an internal clock and related circuit thereof.

It is another object of the present invention to provide a method for generating an internal clock and the related circuit thereof for making an accurate sampling of data even if there is a skew between the clock and data applied to a semiconductor memory.

It is a still another object of the present invention to provide a method for generating an internal clock and the related circuit thereof, in which delay time is controlled by an external code.

To accomplish the aforementioned objects in accordance with an aspect of the present invention, there is provided an internal clock generating circuit comprising:

a receiver for receiving an external clock;

a delay compensation circuit for taking an output clock of the receiver and delaying it by as much as the compensation delay time and control delay time subtracted from the cycle of the external clock;

an external control delay unit for delaying an output of the delay compensation circuit by as much as the sum of the control delay time and unit increase/decrease delay time in response to an external control code; and an internal clock driver for driving an output of the external control delay unit and generating an internal clock centered about an externally applied data, thereby performing an accurate timing control to an external clock without any loss of performance.

In accordance with another aspect of the present invention, there is provided a method for generating an internal clock comprising the steps of:

delaying an external clock output through the receiver by as much as the compensation and control delay time is subtracted out of the cycle of the external clock;

delaying the output of the delay compensation circuit by as much as the control delay time and unit increase/decrease delay time are added in response to a digital control code; and driving the output generated in the delaying step as an internal clock.

BRIEF DESCRIPTION OF THE DRAWINGS

The above and other objects and advantages of the present invention will become more apparent by describing in detail preferred embodiments thereof with reference to the accompanying drawings in which:

FIG. 9 is a block diagram for illustrating another circuit for internal clock signal generation according to an embodiment of the present invention.

DETAILED DESCRIPTION OF PREFERRED EMBODIMENTS

Hereinafter, a preferred embodiment of the present invention will be described in detail with reference to accompanying drawings. However, the embodiments of the present invention may be modified into various other forms, and the scope of the present invention must not be interpreted as being restricted to the embodiments. The embodiments are provided to more completely explain the present invention to those skilled in the art. Like numbers refer to like elements throughout and signal lines and signals thereon may be referred to by the same reference symbols.

Figure 1A:
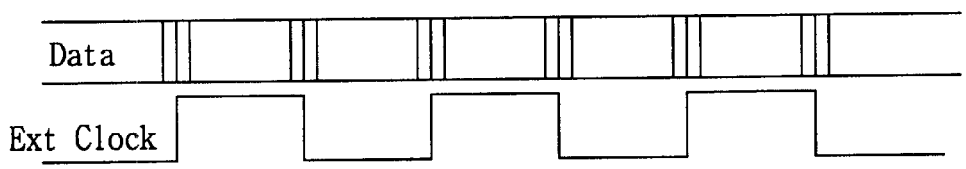
FIGS. 1A and 1B are timing diagrams illustrating data synchronized with clock signal and clock signal centered about data, respectively.
Figure 1B:
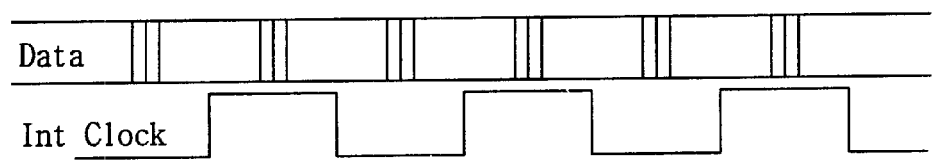
Figure 2A:
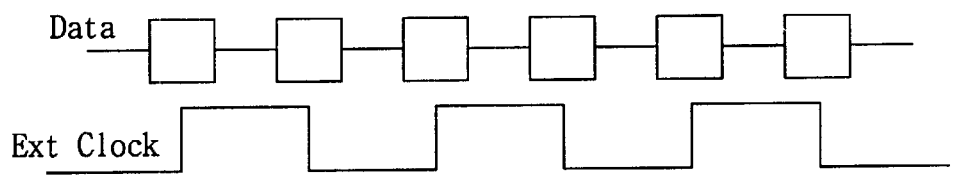
FIGS. 2A and 2B are timing diagrams illustrating double and single data rates, respectively.
Figure 2B:
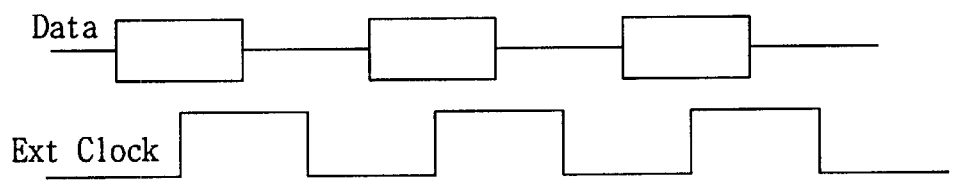
Figure 3:
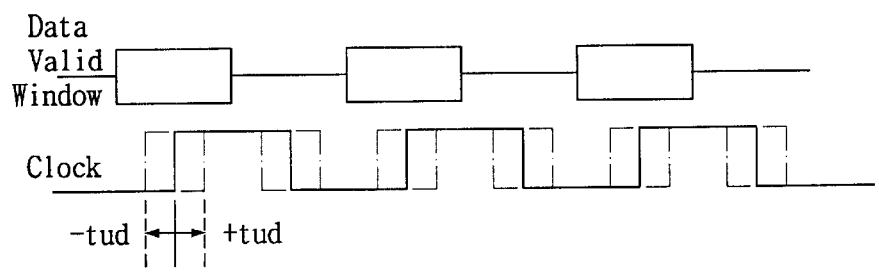
FIG. 3 is a timing diagram illustrating a centered clock signal by adding delay time during set-up or hold time.

FIG. 3 is a timing chart for illustrating a centered clock signal by adding time delay during set-up or hold time. According to an embodiment of the present invention, if there is a function to selectively push or pull a clock signal along the time axis, as shown in FIG. 3, at a slave, an externally set digital code is applied to the slave to control the clock signal. In other words, the digital code is a command applied to the slave whether a predetermined period of the clock signal is pushed or pulled before normal operations of the slave. According to a preferred embodiment of the present invention, the digital code is externally set up, thereby enabling a sampling clock signal to be centered according to the preset digital code. Accordingly, the slave performs its setup/hold centering function of a data sampling clock signal by receiving the digital code and performing±time delay operation.

Figure 4A:
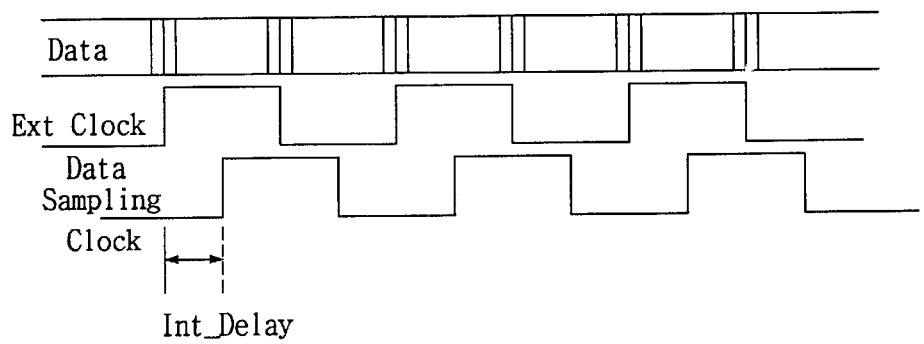
FIG. 4A is a timing diagram for illustrating generation of an internal clock signal when an external clock signal is synchronized with data according to an embodiment of the present invention.
Figure 4B:
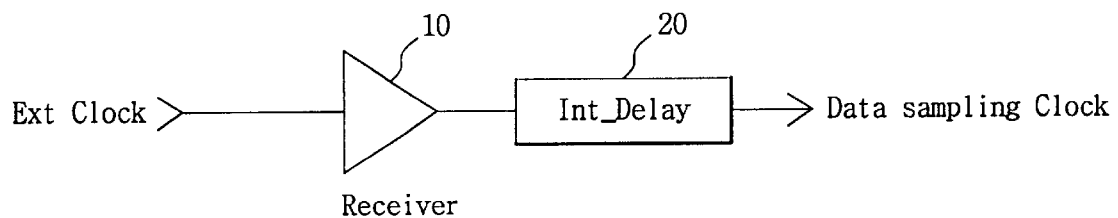
FIG. 4B is a circuit for generating the internal clock with the timing shown in FIG. 4A.
Figure 4C:
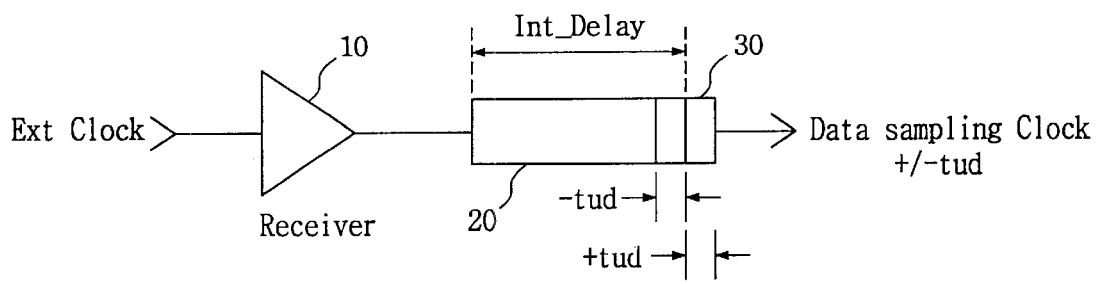
FIG. 4C is another circuit for generating the internal clock with the timing shown in FIG. 4A.

FIG. 4A is a timing chart for illustrating generation of an internal clock signal when an external clock signal is supplied with being synchronized with data according to an embodiment of the present invention. FIGS. 4B and 4C are circuits for illustrating generation of an internal clock signal when an external clock signal is supplied. The external clock is synchronized with data according to an embodiment of the present invention. Referring to FIG. 4B, an internal delay 20 is connected to a receiver 10. The receiver 10 receives an external clock signal, and the internal delay 20 delays the external clock signal for the predetermined amount or the proportional amount to frequency, and obtains a data sampling clock signal. If the internal delay 20 shown in FIG. 4B is a fixed delay, it is difficult to control the timing. Thus, according to a preferred embodiment of the present invention, an internal delay includes a user defined delay 'tud' to control a data sampling clock signal as shown in FIG. 4C.

Figure 5A:
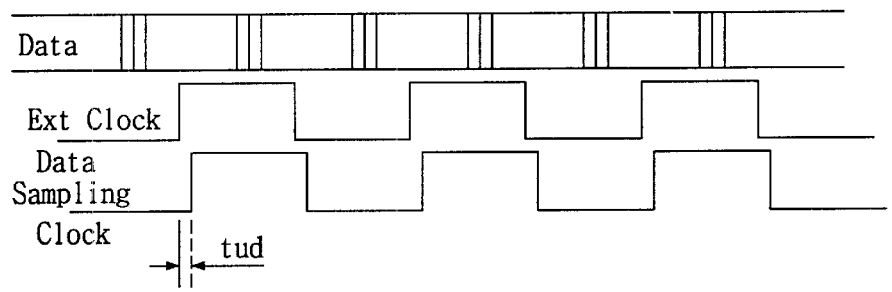
FIG. 5A is a timing diagram for illustrating generation of an internal clock signal when an external clock signal is centered on data according to an embodiment of the present invention.
Figure 5B:
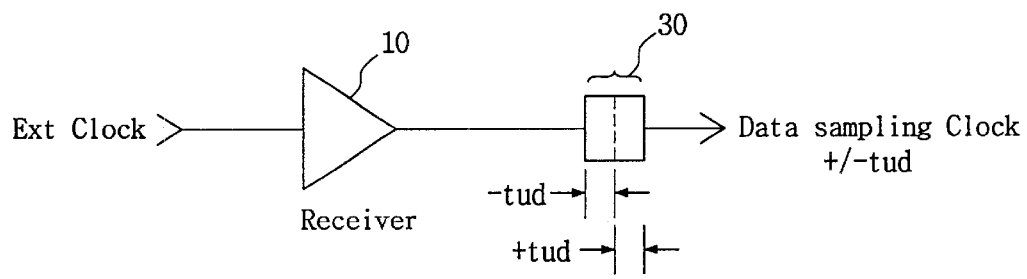
FIG. 5B is a circuit for generating the internal clock with the timing shown in FIG. 5A.

FIG. 5A illustrates a case that an external clock signal is supplied which is centered about the data. At this time, it is necessary that an internal clock signal similar to the timing of the external clock signal should be generated as a sampling clock signal. Therefore, as shown in FIG. 5B, a ±tud is installed at the rear end of the receiver 10 as a delay part 30 for controlling sampling timing in FIG. 5A. At this time, the delay '−tud' is set as a default delay (preset delay). If the delay part 30 as shown in FIG. 5B generates a data sampling clock signal, the timing control of ±tud is achieved without any loss of performance by controlling timing. However, in FIG. 5B, there is a loss of timing margin for the amount of '−tud' in a chip, resulting a restriction to the performance of the chip. In other words, if a data sampling clock signal is obtained through the delay part 30 as shown in FIG. 5B as an internal clock signal for performing the timing control to the data being centered, there is generated an extra delay for the amount of a unit increase/decrease delay tud, as shown in FIG. 6, which restricts the performance of a chip.

Figure 5C:
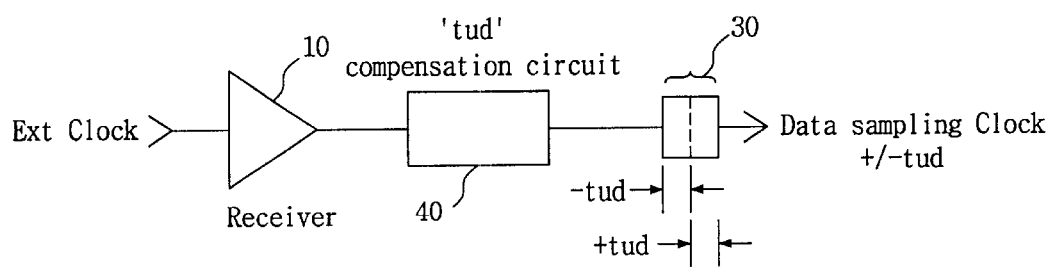
FIG. 5C is another circuit for generating the internal clock with the timing shown in FIG. 5A.
Figure 6:
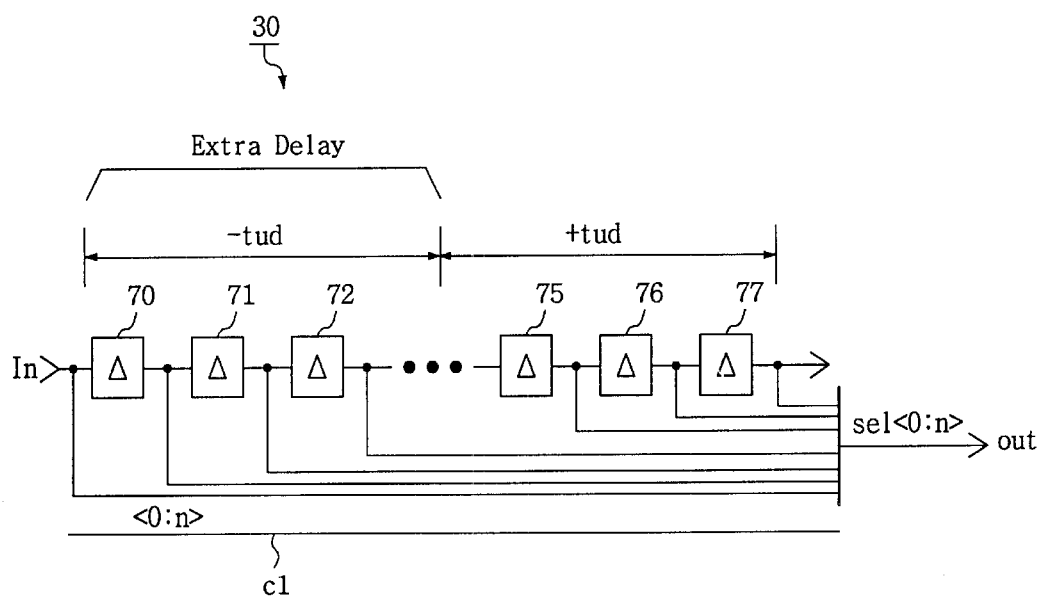
FIG. 6 is a schematic diagram of the delay shown in FIGS. 4C and 5C.

FIG. 6 is a schematic diagram of the delay part shown in FIGS. 4C and 5C, wherein one iunit increase/decrease delay includes a plurality of delays 70–72, and 75–77. Delayed clock signals are output to an output terminal 'out' through a plurality of delays 70–72, and 75–77 correspondingly positioned at a stage in response to a selected control code applied through a control line C1.

According to an embodiment of the present invention, the clock compensation circuit is provided, which includes a delay locked loop (DLL), synchronous mirror delay (SMD) or bi-directional delay (BDD) to prevent any restriction of performance. Also, if an external clock signal is synchronized with data, it is preferable to process as a mode option. According to a preferred embodiment of the present invention, if delay compensation caused by operations of a receiver or a driver is taken by utilizing DLL and SMD or BDD, a more accurate internal clock signal can be obtained. Therefore, preferably, if a circuit that can compensate the timing margin, that is, the delay compensation circuit 40 shown in FIG. 5C is installed as a 'tud compensation circuit' between the receiver 10 and a delay part 30, there will be no loss of timing margin.

Likewise, in the embodiment of the present invention, a mode option is processed when a clock signal is supplied which is synchronized with data or centered on data. The delay compensation circuit is used to perform the timing control by an external digital code without any restriction to performance of a chip. To make an accurate centering of a data sampling internal clock signal to a data valid window, the internally generated data sampling clock signal is pushed or pulled according to an external digital code to generate a digitally controlled internal clock signal. At this time, an external digital code is used because the digital code is easier than an analog code to get the data sampling clock signal to be selectively pushed or pulled by a few digital time steps (total±tud).

Now, a detailed description will be made with reference to FIGS. 7, 8 and 9 without any intention to put a limitation to the scope of the present invention about internal clock generating circuits and the related methods in which a mode option is processed and a delay compensation circuit is utilized to perform a timing control by an external digital code without any restriction to performance of a chip.

Figure 7:
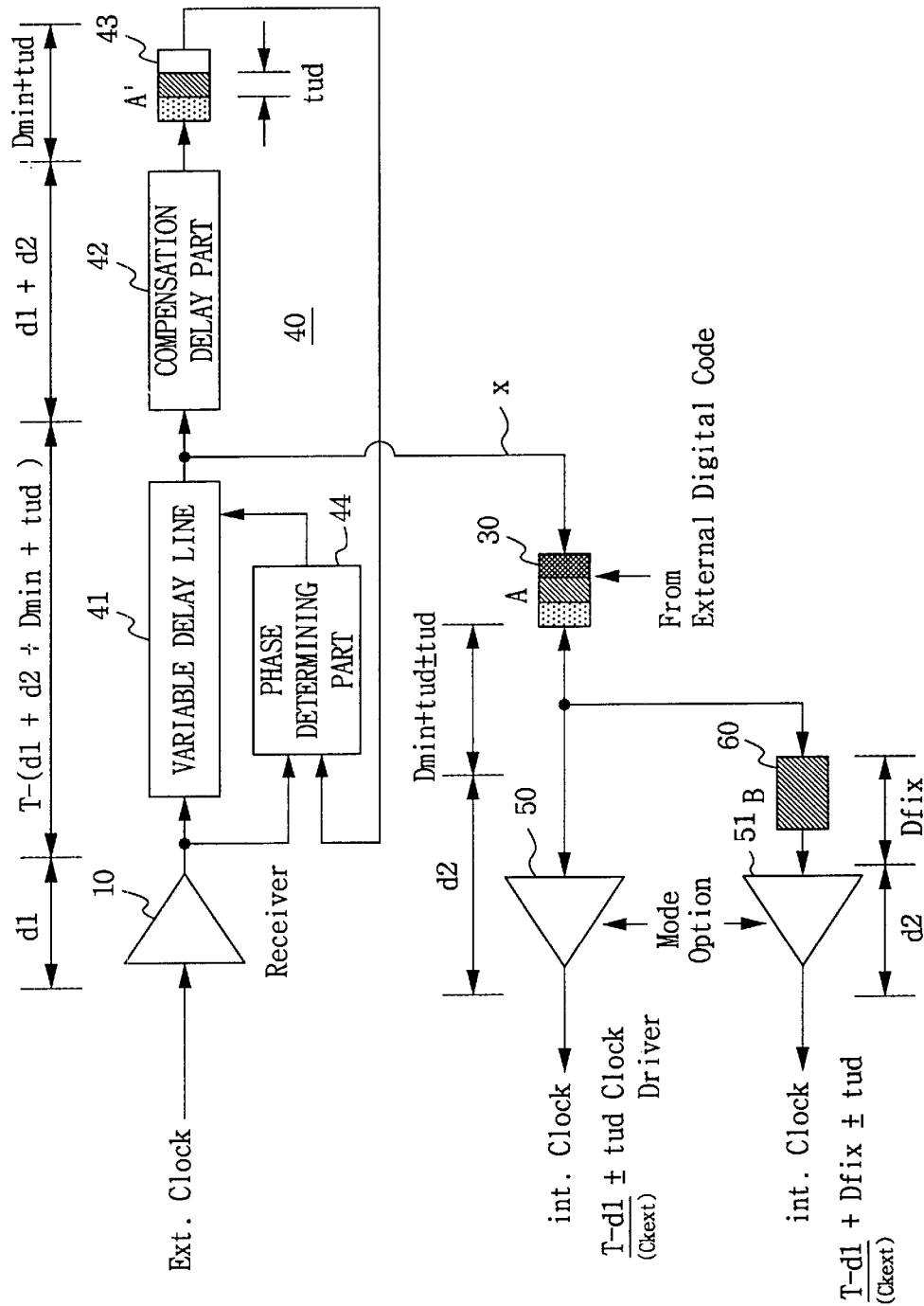
FIG. 7 is a block diagram illustrating an internal clock signal generating circuit using DLL according to an embodiment of the present invention.
Figure 8:
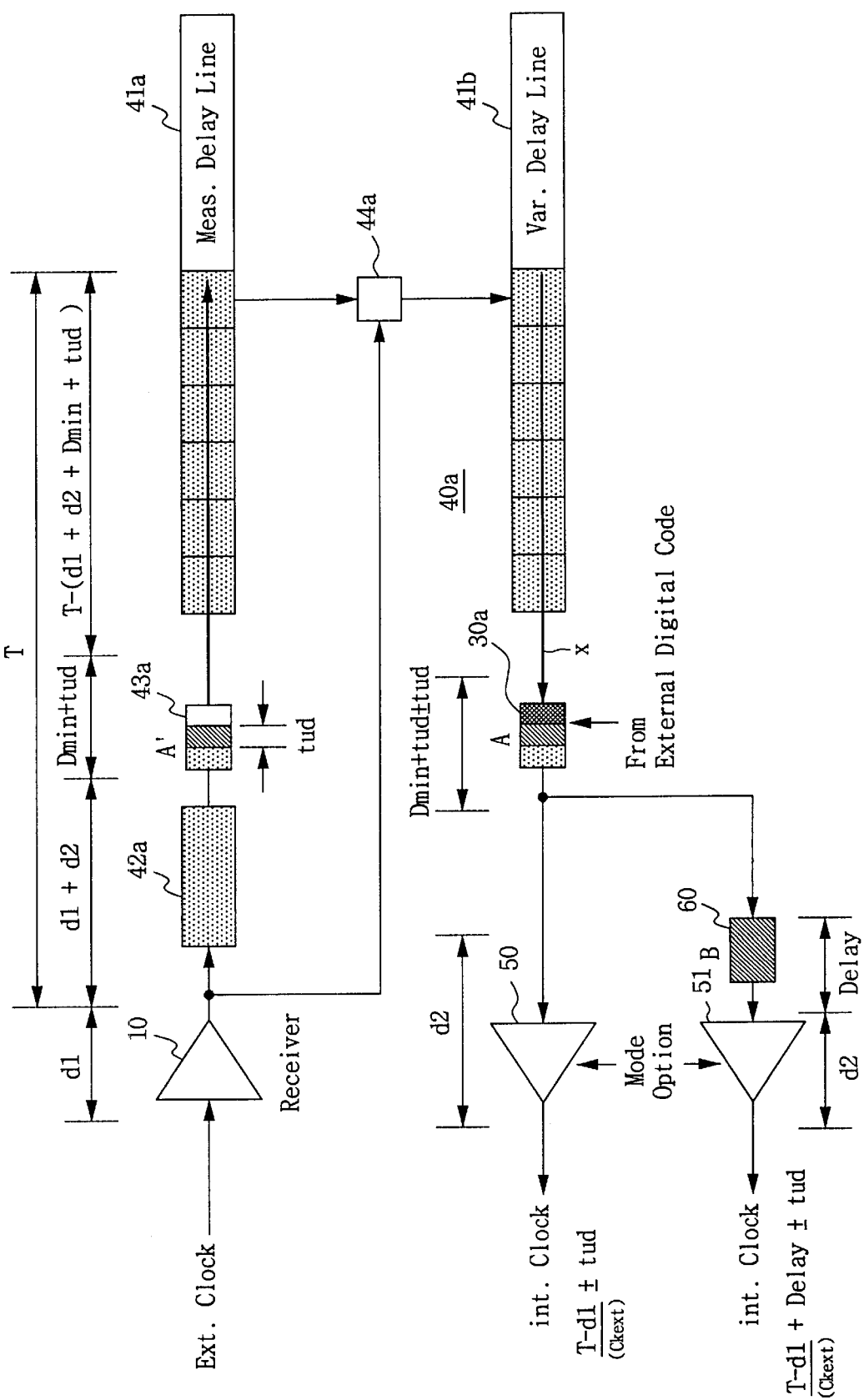
FIG. 8 is a block diagram for illustrating an internal clock signal generating circuit using SMD according to another embodiment of the present invention.

FIGS. 7 and 8 are block diagram illustrating an internal clock signal generating circuit using DLL and SMD, respectively, according to an embodiment of the present invention. FIG. 9 is a block diagram illustrating another circuit modified with the structure shown in FIG. 8.

Referring to FIG. 7, the internal clock generating circuit includes a receiver 10, an external control delay part 30, a delay compensation circuit 40, and an internal clock driver 50. The receiver 10 receives an external clock signal. The delay compensation circuit 40 receives a clock signal output of the receiver 10 and compensates the clock signal output of the receiver 10 for the amount of a cycle of an external clock signal T after subtracting a compensation delay time d1+d2 and a control delay time Dmin+tud. Here, d1 denotes a delayed time by the receiver 10 and d2 denotes a delayed time by the internal clock driver 50 or 51. The external control delay part 30 receives an output signal of the delay compensation circuit 40, and delays the output signal of the delay compensation circuit 40 in response to an external digital code for the amount of the control delay time Dmin+tud and a unit increase/decrease delay time±tud. The internal clock driver 50 generates an internal clock signal being centered to an external applied data by receiving the output signal of the external control delay part 30.

According to an embodiment of the present invention, the internal clock generating circuit further includes a second internal clock driver 51, which is installed in parallel to the internal clock driver 50 and connected to the external control delay part 30. The second internal clock driver 51 drives as a mode option when an external clock signal is supplied with being synchronized with data. A fixed delay part 60 is generally installed between the external control delay part 30 and the second internal clock driver 51. The delay time of the fixed delay 60 is about ¼ cycle of the external clock signal if the external clock signal has a duty rate of about 50%.

According to an embodiment of the present invention, the delay compensation circuit 40 includes a variable delay line 41, a compensation delay part 42, a control delay time delay part 43, and a phase determining part 44. The variable delay line 41 delays the output signal of the receiver 10 for the amount of a compensation delay time d1+d2 and a control delay time Dmin+tud. The compensation delays part 42 delays the output signal of the variable delay line 41 for the amount of the compensation delay time d1+d2 to compensate a delay by the receiver 10, the internal clock driver 50 and 51. The control delay time delay part 43 delays the output signal of the compensation delays part 42 for the amount of the control delay time Dmin+tud. The phase determining part 44 compares the output signal of the receiver 10 and the output signal of the control delay time delay part 43, and supplies a phase control signal to the variable delay line 41 according to the compared phase differences between the output clock of the receiver 10 and the output of the control delay time delay part 43.

As shown in FIG. 7, in case of the delay compensation circuit 40 using DLL, a clock compensated to the receiver's delay d1, the internal clock driver's delay d2 and a control delay time Dmin+tud is generated at node X. The clock, T−(d1+d2+Dmin+tud), is supplied to the external control delay part 30, and then put through the delay step of 'Dmin+tud±tud' in response to an external digital control code. If an external clock signal is supplied with being centered on data, it is put through the clock driver 50 as a mode option, a clock of 'T−d1±tud' can be obtained. At this time, the 'T−d1' is a clock having the same phase as that of the external clock signal, so that an extra delay of for the amount of ±tud is externally added by the timing control. In the drawing, the delay designated by the symbol A' in the control delay time delay part 43 is to compensate the delay of the symbol A in the external control delay part 30, and it can be an analog delay terminal DTC controlled by a digital delay or a digital code.

On the other hand, if an external clock signal is applied which is synchronized with data, it is put through the fixed delay 60 to thereby obtain an internal clock signal through the second clock driver 51. The internal delay Dfix designated by symbol B in the second internal clock driver 60 can be a fixed delay having a delay for the amount of about T/4 of the external clock or a delay proportional to frequency. At this time, it is possible to obtain an internal clock signal delayed for the amount of 'T−d1+Dfix±tud' through the second clock driver 51. The internal clock is a sampling clock being centered to the data valid window. By the structure shown in FIG. 7, it becomes possible to perform an accurate timing control to an external clock without any loss of performance.

Referring to FIG. 8, the internal clock generating circuit includes a receiver 10, an external control delay part 30*a*, a delay compensation circuit 40*a*, and an internal clock driver 50. The receiver 10 receives an external clock signal. The delay compensation circuit 40*a* receives a clock signal output of the receiver 10 and compensates the clock signal output of the receiver 10 for the amount of a cycle of an external clock signal T after subtracting a compensation delay time d1+d2 and a control delay time Dmin+tud. Here, d1 demotes a delayed time by the receiver 10 and d2 denotes a delayed time by the internal clock driver 50 or 51. The external control delay part 30*a* receives an output signal of the delay compensation circuit 40*a*, and delays the output signal of the delay compensation circuit 40*a* in response to an external digital code for the amount of the control delay time Dmin+tud and a unit increase/decrease delay time±tud. The internal clock driver 50 generates an internal clock signal being centered to an external applied data by receiving the output signal of the external control delay part 30*a*.

According to an embodiment of the present invention, the internal clock generating circuit further includes a second internal clock driver 51, which is installed in parallel to the internal clock driver 50 and connected to the external control delay part 30*a*. The second internal clock driver 51 drives as a mode option when an external clock is supplied with being synchronized on data, a fixed delay part 60 is generally installed between the external control delay part 30*a* and the second internal clock driver 51.

According to an embodiment of the present invention, the internal clock generating circuit further includes a second internal clock driver 51, which is installed in parallel to the internal clock driver 50 and connected to the external control delay part 30*a*. The second internal clock driver 51 drives as a mode option when an external clock is being synchronized with data. A fixed delay part 60 is generally installed between the external control delay part 30*a* and the second internal clock driver 51. The delay time of the fixed delay 60 is about ¼ cycle of the external clock signal if the external clock signal has a duty rate of about 50%.

According to an embodiment of the present invention, the delay compensation circuit 40*a* includes a compensation delay part 42*a*, a control delay time delay part 43*a*, a measuring delay line 41*a*, a comparison and transmission part 44*a*, and a variable delay line 41*b*. The compensation delay part 42*a* delays the output of the receiver's clock signal for the amount of the compensation delay time d1+d2 to compensate delay by the receiver 10 and the internal clock driver 50 and 51. The control delay time delay part 43*a* delays the output of the compensation delay part 42*a* for the amount of the control delay time Dmin+tud. The measuring delay line 41*a* delays the output of the control delay time delay part 43*a* for the amount of a cycle of an external clock T after subtracting the compensation delay time d1+d2 and the control delay time Dmin+tud. The comparison and transmission part 44*a* compares the output of the receiver 10 and the output of the measuring delay line 41*a*, and transmits the result to the variable delay line 41*b*. The variable delay line 41*b* delays the output of the comparison and transmission part 44*a* for the amount of the cycle (T) of the external clock after subtracting the compensation delay time d1+d2 and the control delay time Dmin+tud.

In FIG. 8, in case of the delay compensation circuit 40*a* using SMD, a clock compensated for the receiver's delay d1, the clock driver's delay d2, and the control delay time Dmin+tud is generated at node X. Then, the clock is supplied to the external control delay part 30*a* and then put through the delay step of 'Dmin+tud±tud' by an external digital control code. If an external clock signal is supplied with being centered, it is directly put through the clock driver 50 as a mode option, a clock of 'T−d1±tud' can be obtained. At this time, the 'T−d1' is a clock having the same phase as that of the external clock, so that an extra delay of as much as ±tud is externally added by the timing control.

In the drawing, the delay designated by the symbol A' in the control delay time delay part 43a is to compensate the delay of the symbol A in the external control delay part 30a, and it can be an analog delay terminal DTC to be controlled by digital delay or digital code.

On the other hand, if an external clock signal is supplied which is synchronized with data, it is put through the fixed delay 60 to thereby obtain an internal clock through the second clock driver 51. The internal delay Dfix designated by symbol B in the fixed delay 60 can be a fixed delay having a delay for the amount of about T/4 of the external clock or a delay proportional to frequency. At this time, it is possible to obtain an internal clock delayed for the amount of 'T−d1+Dfix±tud' through the clock driver 51. The internal clock is a sampling clock centered to the data valid window. By the structure shown in FIG. 8, it becomes possible to perform an accurate timing control to an external clock without any loss of performance.

As shown in FIG. 9, the control delay time delay part 43a and the external control delay part 30a are positioned in reverse to those shown in FIG. 8. The circuit shown in FIG. 9 is an open loop, thereby making it possible to obtain an internal clock signal having the same phase as that in FIG. 8, even if positions of some parts are exchanged.

As described above, there is an advantage in the present invention in that it is possible to generate an internal clock signal for accurate sampling data even if there is a skew between the clock and data applied to a semiconductor memory.

Having described embodiments of a device and a method for generating internal clock signal, it is noted that modifications and variation can be made by persons skilled in the art in light above teachings. It is therefore to be understood that changes may be made in the particular embodiments of the invention disclosed which are within the scope and spirit of the invention as defined by the appended claims. Having thus described the invention with the details and particularity required by the patent laws, what is claims and desired protected by Letters Patent is set for in the appended claims.

What is claimed is:

1. An internal clock generating circuit comprising:
   a receiver for receiving an external clock;
   a delay compensation circuit for receiving an output clock of the receiver and delaying the output clock of the receiver for a cycle of the external clock after subtracting a compensation delay time and a control delay time;
   an external control delay part for receiving an external digital code and an output clock of the delay compensation circuit, and delaying the output clock of the delay compensation circuit for the amount of the sum of the control delay time and a unit increase/decrease delay time in response to the external digital code; and
   an internal clock driver for driving an output clock of the external control delay part and generating an internal clock substantially centered to an externally applied data.

2. The circuit as defined in claim 1, wherein the delay compensation circuit comprises:
   a variable delay line for delaying the output clock of the receiver for the amount of a cycle of the external clock after subtracting of the compensation delay time and the control delay time;
   a compensation delay part for delaying an output clock of the variable delay line for the amount of the compensation delay time to compensate delays by the receiver and the internal clock driver;
   a control delay time delay part for delaying the output clock of the compensation delay part for the amount of the control delay time; and
   a phase determining part for comparing the output clock of the receiver and the output clock of the control delay time delay part, and for supplying a phase control signal to the variable delay line according to the compared phase differences between the output clock of the receiver and the output clock of the control delay time delay part.

3. The circuit as defined in claim 1, wherein the delay compensation circuit comprises:
   a compensation delay part for delaying an output clock of the receiver for the amount of the compensation delay time to compensate the delay resulting from operations of the receiver and the internal clock driver;
   a control delay time delay part for delaying an output clock of the compensation delay part clock for the amount of the control delay time;
   a measuring delay line for delaying an output clock of the control delay time delay part for the amount of a cycle of the external clock after subtracting the compensation delay time and the control delay time; and
   a comparison and transmission part for comparing the output clock of the receiver and the output clock of the measuring delay line, and transmitting the compared results to a variable delay line, wherein the variable delay line for delaying an output clock of the comparison and transmission part for the amount of a cycle of the external clock after subtracting the compensation delay time and the control delay time.

4. The circuit as defined in claim 1, wherein the delay compensation circuit comprises a delay locked loop (DLL) and a synchronous mirror delay (SMD).

5. The circuit as defined in claim 1, wherein the external control delay part comprises a digital delay and an analog delay.

6. The circuit as defined in claim 1, further comprising a second internal clock driver at the rear end of the external control delay part when the external clock is being synchronized with data.

7. The circuit as defined in claim 6, further comprising a fixed delay part between the external control delay part and the second internal clock driver.

8. The circuit as defined in claim 7, wherein the fixed delay part delays about ¼ cycle of the external clock.

9. A method for generating an internal clock from an externally applied clock by selectively delaying an internally generated data sampling clock according to digital time steps controlled by an external digital code to center the internal clock to a data valid window.

10. A method for generating an internal clock comprising the steps of:
   first delaying an external clock for the amount of a first predetermined amount of clock;
   second delaying the first delayed clock for the amount of a cycle of the external clock after subtracting a compensation delay time and a control delay time;
   third delaying the second delayed clock for the amount of the sum of the control delay time and a unit increase/decrease delay time in response to a digital control code; and
   driving the third delayed clock as an internal clock, wherein the third delayed clock is delayed for the amount of a second predetermined amount of clock during driving the third delayed clock, wherein the compensation delay time is a sum of the first predetermined amount of clock and the second predetermined amount of clock.

11. A method as defined in claim 10, further including the step of delaying for the amount of the third predetermined amount of clock after the third delaying when the external clock is supplied with being synchronized with data.

12. A method as defined in claim 11, wherein the third predetermined amount of clock is about ¼ cycle of the external clock.

* * * * *